(12) United States Patent
Ogawa

(10) Patent No.: US 8,623,127 B2
(45) Date of Patent: Jan. 7, 2014

(54) METAL MOLD, PROCESS FOR MANUFACTURING THE SAME, AND MOLDED ARTICLE PRODUCED USING THE MOLD

(75) Inventor: Kazufumi Ogawa, Awa (JP)

(73) Assignee: Empire Technology Development LLC, Wilmington, DE (US)

( * ) Notice: Subject to any disclaimer, the term of this patent is extended or adjusted under 35 U.S.C. 154(b) by 173 days.

(21) Appl. No.: 12/666,954

(22) PCT Filed: Feb. 18, 2008

(86) PCT No.: PCT/JP2008/052620
§ 371 (c)(1),
(2), (4) Date: Dec. 28, 2009

(87) PCT Pub. No.: WO2009/104235
PCT Pub. Date: Aug. 27, 2009

(65) Prior Publication Data
US 2010/0301191 A1    Dec. 2, 2010

(51) Int. Cl.
  *B05D 1/00*   (2006.01)
  *B05D 7/14*   (2006.01)
(52) U.S. Cl.
  USPC .................. 106/38.2; 427/503; 427/409
(58) Field of Classification Search
  USPC ............ 106/38.2, 38.22, 38.28; 427/384, 503
  See application file for complete search history.

(56) References Cited

U.S. PATENT DOCUMENTS

| | | | |
|---|---|---|---|
| 5,538,762 A * | 7/1996 | Ogawa et al. | 427/503 |
| 5,907,013 A * | 5/1999 | Ogawa | 524/730 |
| 2002/0127499 A1* | 9/2002 | Endo et al. | 430/327 |
| 2005/0009985 A1* | 1/2005 | Selbertinger et al. | 524/589 |

FOREIGN PATENT DOCUMENTS

| | | |
|---|---|---|
| JP | 05-193056 | 8/1993 |
| JP | 05-230215 | 9/1993 |
| JP | 2000-026608 | 1/2000 |
| JP | 2005-280020 | 10/2005 |

OTHER PUBLICATIONS

Howarter et al. 2005, School of Materials Engineering, Purdue University, "Fluorinated Surfactants as Stimuli-Responsive Polymers and Brushes".*
"Teflon Processing to achieve optimum utilization of fluorine resin coating ," accessed at http://www.y-skt.co.jp/clearcoat.html, accessed on Mar. 26, 2013, pp. 2.
International Search Report for International Application No. PCT/JP2008/052620, Japanese Patent Office, mailed on May 20, 2008.

* cited by examiner

*Primary Examiner* — Pegah Parvini
(74) *Attorney, Agent, or Firm* — Workman Nydegger

(57) ABSTRACT

The mold has a mold surface on which is formed as a release film a water-repellent and oil-repellent fluorocarbon-based chemisorbed film having a thickness that is uniform in nanoscale and having a controlled surface energy. As a result, even when a mold has an ultrafine shape on the nanometer scale, the mold allows high precision molding excellent in fluidity and penetrativity of a molding material. In addition, this mold eliminates the application of a release agent and can prevent a release agent from adhering to a molded article.

7 Claims, 4 Drawing Sheets

METAL MOLD, PROCESS FOR MANUFACTURING THE SAME, AND MOLDED ARTICLE PRODUCED USING THE MOLD

TECHNICAL FIELD

The disclosure relates to a mold having a releasable composite film formed on a surface thereof.

Note that a mold as described herein relates to a releasable mold used for molding optical parts, machine parts, recording media, electronic parts, biochemical chips, medical supplies, and the like in which a release agent cannot be used to maintain precision, and to a releasable mold to which a release agent cannot be applied because it is disadvantageous if the release agent adheres to a molded article.

BACKGROUND

Generally, it has been already well-known that a chemisorption solution comprising a chlorosilane-based adsorbent containing a fluorocarbon group and a non-aqueous organic solvent can be used to effect chemisorption in a liquid phase so as to form a water-repellent chemisorbed film in the form of a monomolecular film (for example, refer to Japanese Patent Laid-Open No. 05-193056).

A manufacture principle of the monomolecular chemisorbed film in such a solution is in forming a monomolecular film by means of dehydrochlorination reaction between active hydrogen, such as a hydroxyl group on a substrate surface, and a chlorosilyl group of the chlorosilane-based adsorbent.

DETAILED DESCRIPTION

Figure 1A:
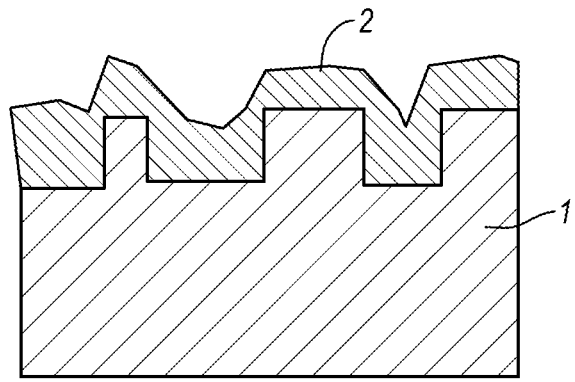
FIG. 1 is a conceptual diagram of a section (a) of a conventional mold and a section (b) of the mold of the present invention, wherein (a) shows the state where a release agent is applied to the surface of the mold, and (b) shows the state where a releasable monomolecular film is formed on the surface of the mold.

As for the improvement of the mold releasability in molding with a mold, emphasis has been put on the shape of the mold itself or improvement of a release agent. However, with respect to molding with a mold requiring nanoscale precision, such as the molding of optical parts, a conventional method based on geometrical improvement or spraying of a release agent causes a variation of about several-ten to several-hundred nanometers in the film thickness of the release agent 2 applied to the surface of the mold 1, as shown in FIG. 1A. Such a method is not optimal because the variation of the mold is generated in every molding. Further, adhesion of a release agent to a molded article may often produce disadvantages. However, a high precision mold using no release agent is not yet put in practical use.

On the other hand, conventional chemisorbed films involve only the chemical bond between an adsorbent and a substrate surface. Therefore, such a chemisorbed film is poor in abrasion resistance when it is used for a mold as it is. Further, there was a problem of reduction in penetrating fluidity and penetrativity of a molding material due to an excessively small surface energy when a monomolecular film made only of a fluorocarbon-based material is used.

The present technological advancement has been made in the light of the above problem, and an object of the technological advancement is to provide a mold requiring no release agent which does not impair a processed shape of a high precision mold, has a proper mold releasing function controlling surface energy, and has high molding durability.

Figure 1B:
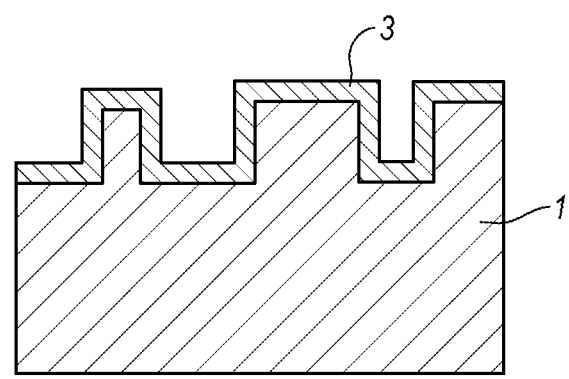

In order to achieve the above object, the gist of the technological advancement is as follows. The mold of the technological advancement has a mold surface 1 on which is formed as a release film 3 a water-repellent and oil-repellent fluorocarbon-based chemisorbed film having a thickness that is uniform in nanoscale and having a controlled surface energy, as shown in FIG. 1B. As a result, even when the mold has an ultrafine shape on the nanometer scale, the mold allows high speed and high precision molding excellent in fluidity and penetrativity of a molding material. In addition, forming such a release film eliminates the application of a release agent and can prevent a release agent from adhering to a molded article.

Specifically, a first aspect of the technological advancement provides a releasable mold having a highly durable releasable composite film formed on a surface thereof, wherein the film is a composite film having a long-chain substance including a fluorocarbon group and a hydrocarbon group, a short-chain substance including a fluorocarbon group, a hydrocarbon group, and a silyl group, and a substance including a siloxane group.

A second aspect of the present technological advancement provides a releasable mold according to the first aspect, wherein a molecule length of the long-chain substance including a fluorocarbon group and a hydrocarbon group is twice or more of a molecule length of the short-chain substance including a fluorocarbon group, a hydrocarbon group, and a silyl group.

A third aspect of the present technological advancement provides a releasable mold according to the first aspect and the second aspect, wherein the long-chain substance including a fluorocarbon group and a hydrocarbon group has a side chain including a fluorocarbon group and a hydrocarbon group.

A fourth aspect of the present technological advancement provides a releasable mold according to the first aspect to the third aspect, wherein the long-chain substance including a fluorocarbon group and a hydrocarbon group and the short-chain substance including a fluorocarbon group, a hydrocarbon group, and a silyl group are bound and fixed to a silica film having a substance including a siloxane group and/or to a mold surface via the silyl group in the silica film.

A fifth aspect of the present technological advancement provides a releasable mold according to the first aspect to the third aspect, wherein the long-chain substance including a fluorocarbon group and a hydrocarbon group, the short-chain substance including a fluorocarbon group, a hydrocarbon group, and a silyl group, and the substance including a siloxane group are bound and fixed to each other or independently to a mold surface via the silyl group and the siloxane group, respectively.

A sixth aspect of the present technological advancement provides a releasable mold according to the first aspect to the fifth aspect, wherein a molecular composition ratio of the long-chain substance including a fluorocarbon group and a hydrocarbon group, the short-chain substance including a fluorocarbon group, a hydrocarbon group, and a silyl group, and the substance including a siloxane group contained in the releasable composite film is in a range of from 1:10:10 to 1:0.1:0.1.

A seventh aspect of the present technological advancement provides a releasable mold according to the first aspect to the sixth aspect, the mold having the releasable composite film is formed on the surface thereof, wherein the film has a long-chain substance including at least a fluorocarbon group and a hydrocarbon group, and has a critical surface energy controlled in a range of from 5 to 20 mN/m.

A eighth aspect of the present technological advancement provides a releasable mold according to the first aspect to the seventh aspect, wherein the long-chain substance including a fluorocarbon group and a hydrocarbon group is a long-chain substance including an organic fluorine-containing ether group or an organic fluorine-containing polyether group.

A ninth aspect of the present technological advancement provides a releasable mold according to the first aspect to the eighth aspect, wherein the organic fluorine-containing ether group or the organic fluorine-containing polyether group is a functional group represented by any of the following formulae (Formula 1 or Formula 2):

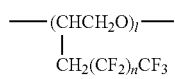

[Formula 1]

(l and n each represent an integer)

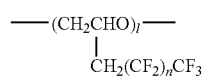

[Formula 2]

(l and n each represent an integer)

A 10th aspect of the present technological advancement provides a releasable mold according to the first aspect to the ninth aspect, wherein the releasable composite film is formed via a silica film.

A 11th aspect of the present technological advancement provides a releasable mold according to the first aspect to the 10th aspect, wherein the composite film further includes a methylsilyl group.

A 12th aspect of the present technological advancement provides a method for manufacturing a releasable mold, including a step of bringing a mold surface into contact with a composite film-forming solution to allow them to react with each other to form a releasable composite film, the solution being obtained by diluting, with an organic solvent, a long-chain substance (1) including at least a fluorocarbon group and a hydrocarbon group and including an alkoxysilyl group, a short-chain substance (2) including a fluorocarbon group, a hydrocarbon group, and an alkoxysilyl group, a substance (3) including an alkoxysilyl group, and a silanol condensation catalyst or other catalyst.

A 13th aspect of the present technological advancement provides a method for manufacturing a releasable mold, including the steps of: bringing a mold surface into contact with a composite film-forming solution to allow them to react with each other to form a film, the solution being obtained by diluting, with an organic solvent, a long-chain substance (1) including at least a fluorocarbon group and a hydrocarbon group and including an alkoxysilyl group, a short-chain substance (2) including a fluorocarbon group, a hydrocarbon group, and an alkoxysilyl group, a substance (3) including an alkoxysilyl group, and a silanol condensation catalyst or other catalyst; and removing excess solution on the mold surface by washing or wiping with an organic solvent.

A 14th aspect of the present technological advancement provides a method for manufacturing a releasable mold according to the 12th aspect and the 13th aspect, wherein a molecular mixing ratio of the long-chain substance (1) including a fluorocarbon group and a hydrocarbon group and including an alkoxysilyl group, the short-chain substance (2) including a fluorocarbon group, a hydrocarbon group, and an alkoxysilyl group, and the substance (3) including an alkoxysilyl group is in a range of from 1:10:10 to 1:0.1:0.1.

A 15th aspect of the present technological advancement provides a method for manufacturing a releasable mold according to the 12th aspect to the 14th aspect, which includes using a long-chain substance including an organic fluorine-containing ether group or an organic fluorine-containing polyether group and an alkoxysilyl group as the long-chain substance (1) including at least a fluorocarbon group and a hydrocarbon group and comprising an alkoxysilyl group.

A 16th aspect of the present technological advancement provides a method for manufacturing a releasable mold according to the 15th aspect, which includes using a substance represented by any of the following formulae (Formula 3 or 4) as the long-chain substance including an organic fluorine-containing ether group or an organic fluorine-containing polyether group and an alkoxysilyl group:

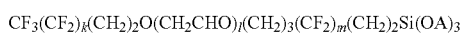

[Formula 3]

(A represents an alkyl group; OA may represent Cl or NCO; and k, l, m, and n each represent an integer)

[Formula 4]

(A represents an alkyl group; OA may represent Cl or NCO; Z represents a linear functional group represented by $(CH_2)_m$, $O(CH_2)_m$, or $(CH_2)_2O(CH_2)_mO(CH_2)_2$; and k, l, m, and n each represent an integer);

using $CF_3$—$(CF_2)_o$—$(CH_2)_2$—$Si(OA)_3$ (wherein subscript o represents an integer; A represents an alkyl group; and OA may represent Cl or NCO) as the short-chain substance (2) including a fluorocarbon group, a hydrocarbon group, and an alkoxysilyl group; and using $(AO)_3Si(OSi(OA)_2)_pOA$ (wherein p represents 0 or an integer; A represents an alkyl group; and OA may represent Cl or NCO) as the substance (3) including an alkoxysilyl group.

A 17th aspect of the present technological advancement provides a method for manufacturing a releasable mold according to the 15th aspect, which includes using a substance represented by the following formula (Formula 5) as the long-chain substance including an organic fluorine-containing ether group or an organic fluorine-containing polyether group and an alkoxysilyl group:

[Formula 5]

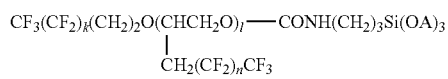

$$CF_3(CF_2)_k(CH_2)_2O(CHCH_2O)_l\text{—}CONH(CH_2)_3Si(OA)_3$$
$$|$$
$$CH_2(CF_2)_nCF_3$$

(A represents an alkyl group; and k, l, and n each represent an integer);

using $CF_3$—$(CF_2)_o$—$(CH_2)_2$—$Si(OA)_3$ (wherein subscript o represents an integer; and A represents an alkyl group) as the short-chain substance (2) including a fluorocarbon group, a hydrocarbon group, and an alkoxysilyl group; and using $(AO)_3Si(OSi(OA)_2)_pOA$ (wherein p represents 0 or an integer; and A represents an alkyl group) as the substance (3) comprising an alkoxysilyl group.

A 18th aspect of the present technological advancement provides a method for manufacturing a releasable mold according to the 12th aspect to the 17th aspect, which includes using a ketimine compound, an organic acid, an aldimine compound, an enamine compound, an oxazolidine compound, an aminoalkylalkoxysilane compound, or a metal oxide such as $TiO_2$ as the other catalyst, instead of the silanol condensation catalyst.

A 19th aspect of the present technological advancement provides a method for manufacturing a releasable mold according to the 12th aspect to the 17th aspect, which includes using a ketimine compound, an organic acid, an aldimine compound, an enamine compound, an oxazolidine compound, an aminoalkylalkoxysilane compound, and/or a metal oxide, such as $TiO_2$, in combination with the silanol condensation catalyst.

A 20th aspect of the present technological advancement provides a method for manufacturing a releasable mold according to the 12th aspect to the 19th aspect, which includes using a fluorocarbon-based organic solvent as the organic solvent.

A 21st aspect of the present technological advancement provides a method for manufacturing a releasable mold according to the 12th aspect to the 20th aspect, further including previously forming a silica film on the mold surface before forming the composite film.

A 22nd aspect of the present technological advancement provides a method for manufacturing a releasable mold according to the 12th aspect to the 21st aspect, which includes heating the composite film at a temperature in the range of from 250 to 450° C. after forming the composite film.

A 23rd aspect of the present technological advancement provides a method for manufacturing a releasable mold according to the 12th aspect to the 21st aspect, including further treating the composite film with a solution containing a substance containing a methylsilyl group dissolved therein after forming the composite film.

A 24th aspect of the present technological advancement provides a molded article to which a release agent is not adhered, the molded article being produced by using the mold as described herein.

The present technological advancement is further specifically described in the following gist. The present technological advancement provides a releasable mold having a highly durable releasable composite film formed on a surface thereof, wherein the film is a composite film including a long-chain substance including a fluorocarbon group and a hydrocarbon group, a short-chain substance including a fluorocarbon group, a hydrocarbon group, and a silyl group, and a substance including a siloxane group, the composite film being formed by the step of bringing a mold surface into contact with a composite film-forming solution to allow them to react with each other to form a releasable composite film, the solution being obtained by diluting, with an organic solvent, a long-chain substance (1) including at least a fluorocarbon group and a hydrocarbon group and including an alkoxysilyl group, a short-chain substance (2) including a fluorocarbon group, a hydrocarbon group, and an alkoxysilyl group, a substance (3) including an alkoxysilyl group, and a silanol condensation catalyst; or by the steps of: bringing a mold surface into contact with a composite film-forming solution to allow them to react with each other to form a film, the solution being obtained by diluting, with an organic solvent, a long-chain substance (1) including a fluorocarbon group and a hydrocarbon group and including an alkoxysilyl group, a short-chain substance (2) including a fluorocarbon group, a hydrocarbon group, and an alkoxysilyl group, a substance (3) including an alkoxysilyl group, and a silanol condensation catalyst; and removing excess solution on the mold surface by washing or wiping with an organic solvent.

Here, mold releasability can be advantageously improved if the molecule length of the long-chain substance including a fluorocarbon group and a hydrocarbon group is twice or more of the molecule length of the short-chain substance including a fluorocarbon group, a hydrocarbon group, and a silyl group.

Further, mold releasability can be further advantageously improved if the long-chain substance including a fluorocarbon group and a hydrocarbon group has a side chain including a fluorocarbon group and a hydrocarbon group.

Further, molding durability can be advantageously improved if the long-chain substance including a fluorocarbon group and a hydrocarbon group and the short-chain substance including a fluorocarbon group, a hydrocarbon group, and a silyl group are bound and fixed to a silica film including a substance having a siloxane group, and/or to the mold surface, via the silyl group in the silica film.

Further, molding durability can be advantageously improved if the long-chain substance including a fluorocarbon group and a hydrocarbon group, the short-chain substance including a fluorocarbon group, a hydrocarbon group, and a silyl group, and the substance including a siloxane group are bound and fixed to each other or independently to the mold surface via the silyl group and the siloxane group, respectively.

Further, release performance and fluidity of a molding material can be advantageously controlled, and molding durability can be advantageously improved, if the molecular composition ratio of the long-chain substance including a fluorocarbon group and a hydrocarbon group, the short-chain substance including a fluorocarbon group, a hydrocarbon group, and a silyl group, and the substance including a siloxane group contained in the releasable composite film is in the range of from 1:10:10 to 1:0.1:0.1.

Further, release performance and fluidity of a molding material can be advantageously controlled, and molding durability can be advantageously improved, if the film comprises the long-chain substance including at least a fluorocarbon group and a hydrocarbon group, and the critical surface energy of the film is controlled in a range of from 5 to 20 mN/m in the mold having a releasable composite film formed on a surface thereof.

Further, molding durability can be advantageously improved if the long-chain substance including a fluorocarbon group and a hydrocarbon group is a long-chain substance including an organic fluorine-containing ether group or an organic fluorine-containing polyether group.

Further, release performance and fluidity of a molding material can be advantageously controlled, and molding durability can be advantageously improved, if the organic fluorine-containing ether group or the organic fluorine-containing polyether group is a functional group represented by any of the following formulae (Formula 6 or Formula 7):

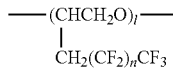

[Formula 6]

(l and n each represent an integer)

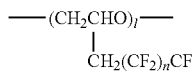

[Formula 7]

(l and n each represent an integer)

Further, molding durability can be further advantageously improved, if the releasable composite film is formed via a silica film.

Further, release performance and fluidity of a molding material can be advantageously controlled, and molding durability can be advantageously improved, if the composite film further includes a methylsilyl group.

Further, release performance and fluidity of a molding material can be advantageously controlled, and molding durability can be advantageously improved, if the molecular mixing ratio of the long-chain substance (1) including a fluorocarbon group and a hydrocarbon group and including an alkoxysilyl group, the short-chain substance (2) including a fluorocarbon group, a hydrocarbon group, and an alkoxysilyl group, the substance (3) including an alkoxysilyl group is in the range of from 1:10:10 to 1:0.1:0.1.

Further, release performance can be advantageously controlled, and molding durability can be advantageously improved by using a long-chain substance including an organic fluorine-containing ether group or an organic fluorine-containing polyether group and an alkoxysilyl group as the long-chain substance (1) including at least a fluorocarbon group and a hydrocarbon group and including an alkoxysilyl group.

Further, release performance and fluidity of a molding material can be advantageously controlled, and molding durability can be advantageously improved by using a substance represented by any of the following formulae (Formula 8 or 9) as the long-chain substance including an organic fluorine-containing ether group or an organic fluorine-containing polyether group and an alkoxysilyl group:

[Formula 8]

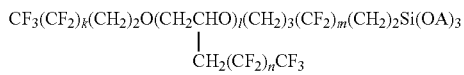

(A represents an alkyl group; OA may represent Cl or NCO; and k, l, m, and n each represent an integer)

[Formula 9]

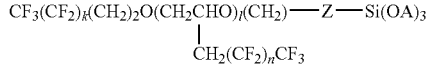

(A represents an alkyl group; OA may represent Cl or NCO; Z represenets a linear functional group represented by $(CH_2)_mO(CH_2)_m$ or $(CH_2)_2O(CH_2)_nO(CH_2)_2$; and k, l, m, and n each represent an interger);

using $CF_3\text{—}(CF_2)_o\text{—}(CH_2)_2\text{—}Si(OA)_3$ (wherein subscript o represents an integer; A represents an alkyl group; and OA may represent Cl or NCO) as the short-chain substance (2) including a fluorocarbon group, a hydrocarbon group, and an alkoxysilyl group; and using $(AO)_3Si(OSi(OA)_2)_pOA$ (wherein p represents 0 or an integer; A represents an alkyl group; and OA may represent Cl or NCO) as the substance (3) including an alkoxysilyl group.

Further, release performance and fluidity of a molding material can be advantageously controlled, and molding durability can be advantageously improved by using a substance represented by the following formula (Formula 10) as the long-chain substance including an organic fluorine-containing ether group or an organic fluorine-containing polyether group and an alkoxysilyl group;

[Formula 10]

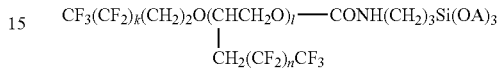

(A represents an alkyl group; and k, l, and n each represent an integer);

using $CF_3\text{—}(CF_2)_o\text{—}(CH_2)_2\text{—}Si(OA)_3$ (wherein subscript o represents an integer; and A represents an alkyl group) as the short-chain substance (2) including a fluorocarbon group, a hydrocarbon group, and an alkoxysilyl group; and using $(AO)_3Si(OSi(OA)_2)_pOA$ (wherein p represents 0 or an integer; and A represents an alkyl group) as the substance (3) including an alkoxysilyl group.

Further, manufacturing time can be advantageously reduced by using a ketimine compound, an organic acid, an aldimine compound, an enamine compound, an oxazolidine compound, an aminoalkylalkoxysilane compound, or a metal oxide, such as $TiO_2$ as the other catalyst, instead of the silanol condensation catalyst.

Further, manufacturing time can be further advantageously reduced by using a ketimine compound, an organic acid, an aldimine compound, an enamine compound, an oxazolidine compound, an aminoalkylalkoxysilane compound, and/or a metal oxide, such as $TiO_2$, in combination with the silanol condensation catalyst.

Further, film uniformity can be advantageously improved by using a fluorocarbon-based organic solvent as the organic solvent. Further, the density of the releasable composite film can be advantageously increased by previously forming a silica film on the mold surface before forming the composite film.

Further, molding durability can be advantageously improved by heating the composite film at a temperature in the range of from 250 to 450° C. after forming the composite film. Further, fluidity of a molding material can be advantageously controlled by further treating the composite film with a solution containing a substance having a methylsilyl group dissolved therein after forming the composite film.

On the other hand, a molded article produced by using the mold of the present technological advancement is advantageous as a food packaging material, clothing, and medical supplies because a release agent is not adhered thereto.

As described above, with regard to the releasable mold and the method for manufacturing the same, the technological advancement has an advantage capable of providing a mold simultaneously satisfying high molding durability, high fluidity and penetrativity of a molding material, and mold releasability, by forming, on the mold surface, a releasable composite film including a long-chain substance including a fluorocarbon group and a hydrocarbon group, a short-chain substance including a fluorocarbon group, a hydrocarbon group, and a silyl group, and a substance including a siloxane group.

The present technological advancement provides a mold which has high molding durability and high fluidity and penetrativity of a molding material and is excellent in mold releasability without using a releasing agent. The present technological advancement provides a releasable mold having a highly durable releasable composite film formed on a surface thereof, wherein the film is a composite film having a long-chain substance including a fluorocarbon group and a hydrocarbon group, a short-chain substance including a fluorocarbon group, a hydrocarbon group, and a silyl group, and a substance including a siloxane group, the composite film being formed by the step of bringing a mold surface into contact with a composite film-forming solution to allow them to react with each other to form a releasable composite film, the solution being obtained by diluting, with an organic solvent, a long-chain substance (1) including at least a fluorocarbon group and a hydrocarbon group and including an alkoxysilyl group, a short-chain substance (2) including a fluorocarbon group, a hydrocarbon group, and an alkoxysilyl group, a substance (3) including an alkoxysilyl group, and a silanol condensation catalyst; or by the steps of bringing a mold surface into contact with a composite film-forming solution to allow them to react with each other to form a releasable composite film, the solution being obtained by diluting, with an organic solvent, a long-chain substance (1) including a fluorocarbon group and a hydrocarbon group and having an alkoxysilyl group, a short-chain substance (2) including a fluorocarbon group, a hydrocarbon group, and an alkoxysilyl group, a substance (3) including an alkoxysilyl group, and a silanol condensation catalyst; and removing excess solution on the mold surface by washing or wiping with an organic solvent.

The above releasable mold can provide a mold which is excellent in molding durability, fluidity and penetrativity of a molding material, and mold releasability by improving a disadvantage of poor abrasion resistance of conventional chemisorbed films. Further, the above manufacturing method can be applied to the manufacturing of a mold for optical components or the like requiring nanometer scale definition because it can provide an ultrathin film excellent in film thickness uniformity.

Hereinafter, the details of the mold (releasable mold) of the present technological advancement which requires no release agent and is excellent in mold releasability will be described using Examples.

Note that, unless otherwise stated, the molecular composition ratio means the molar ratio, and % means % by weight, in the following Examples. Note that the technological advancement in this application is not at all limited to these Examples.

Example 1

First, a stainless steel mold 1 was prepared, and it was washed well and dried. Also, a composite film-forming solution was prepared by using a substance represented by the following formula (Formula 11) as a substance (1) including an organic fluorine-containing ether group or an organic fluorine-containing polyether group and an alkoxysilyl group,

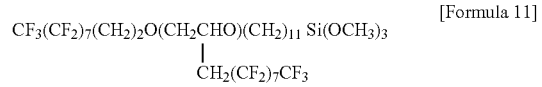

[Formula 11]

using $CF_3-(CF_2)_7-(CH_2)_2-Si(OCH_3)_3$ as a substance (2) including a fluorocarbon group, a hydrocarbon group, and an alkoxysilyl-group, using $Si(OCH_3)_4$ as a substance (3) including an alkoxysilyl group, and dibutyl tin oxide as a silanol condensation catalyst. The substances (1), (2), and (3) were dissolved in a pentafluorobutane solvent containing 30% of dichloropentafluoropropane (chlorine-containing fluorocarbon-based solvent) so that the content thereof may be 0.01, 0.01, 0.003, and 0.00005 M/L, respectively.

Figure 2:
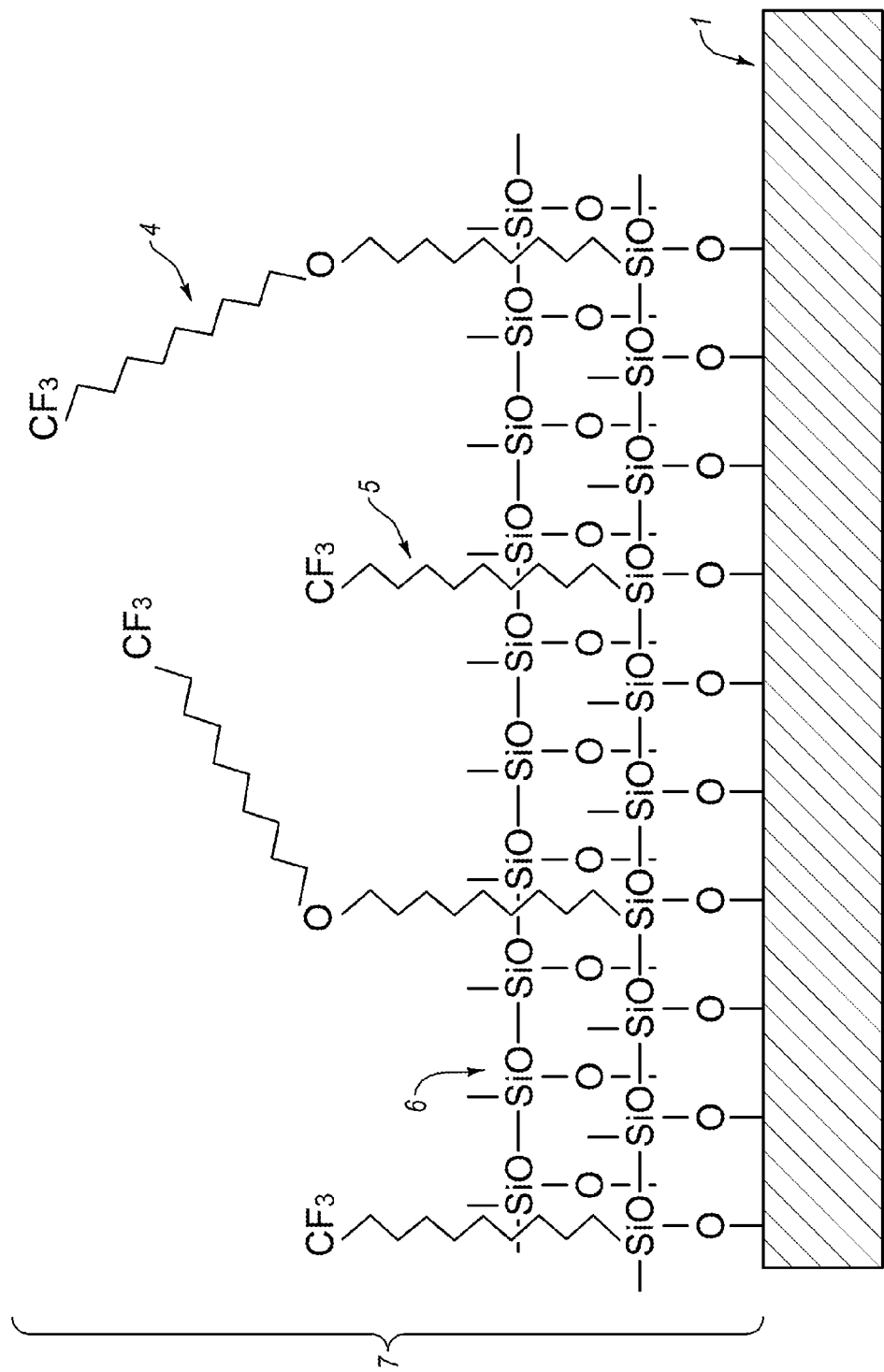
FIG. 2 is a conceptual diagram in which the section of the mold on which a releasable composite film is formed in Example 1 is enlarged to the molecular level.

The stainless steel mold 1 was immersed in the composite film-forming solution and allowed to react for 1 hour in ordinary air (at a relative humidity of 53%; there was no problem even at 65% in a separate experiment). The mold was removed from the solution, and immediately after that, excess of the composite film-forming solution on the surface of the mold was removed by washing with chloroform, and then the mold was exposed to the air. As a result, it was possible to form a composite film 7 having a film thickness of about 5 nm on the surface of the stainless steel mold 1, as shown in FIG. 2. The composite film 7 had a composition ratio of a substance 4 including an organic fluorine-containing polyether group and a silyl group, a substance 5 including a fluorocarbon group, a hydrocarbon group, and a silyl group, and a substance 6 including a siloxane group of about 1:1:0.3, in which the siloxane groups were crosslinked between the fluorocarbon groups.

Note that adsorbed water and many hydroxy groups of natural oxides are contained on the surface of the stainless steel mold. Therefore, the $\equiv Si(OCH_3)$ groups of the substance (1) including an organic fluorine-containing ether group or an organic fluorine-containing polyether group and an alkoxysilyl group, the substance (2) including a fluorocarbon group, a hydrocarbon group, and an alkoxysilyl group, and the substance (3) including an alkoxysilyl group underwent dealcoholization (in this case, deCH$_3$OH (demethanol)) reaction with the hydroxy groups and adsorbed water on the surface of the stainless steel mold in the presence of the silanol condensation catalyst to form, on the surface of the stainless steel mold, a composite film having a substance including an organic fluorine-containing ether group or an organic fluorine-containing polyether group and a silyl group, a substance including a fluorocarbon group, a hydrocarbon group, and a silyl group, and a substance including a siloxane group, which are chemically bound to each other or to the surface over the entire surface of the mold.

Since the composite film at this time had a thickness of nanometer order, the film did not impair the accuracy of finishing of the mold. Further, the water drop contact angle of the surface of the stainless steel mold was about 112 degrees (critical surface energy is about 8 mN/m) regardless of the presence of a washing step, indicating that a mold releasability equal to or higher than that of a Teflon™ coating was imparted.

Figure 3:
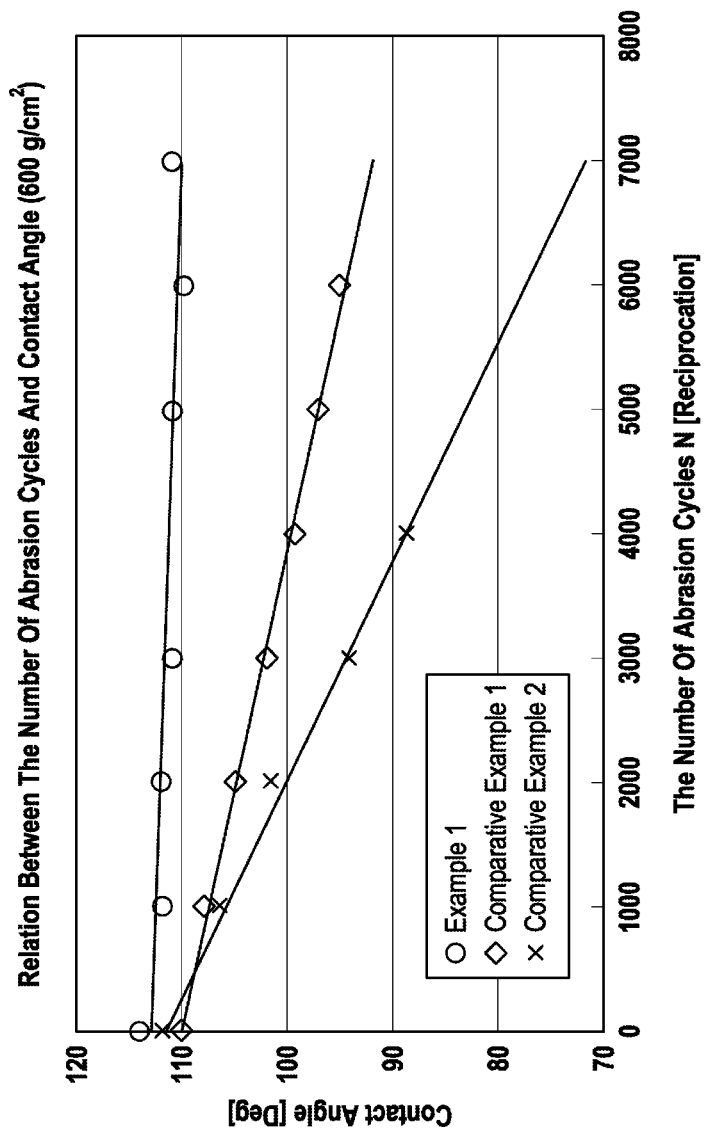
FIG. 3 is a drawing showing the test results of abrasion resistance in terms of the variation of the water drop contact angle of the releasable mold obtained in Example 1 of the present invention in comparison with those of the releasable mold obtained in Comparative Examples 1 and 2.

Further, since this composite film was covalently bound to the mold surface via siloxane bonds, it was possible to maintain the water drop contact angle at 110 degrees or higher even after reciprocatingly rubbed 6000 times under the condition of 600 g/cm² of loading in the abrasion test, as shown in FIG. 3. This condition corresponds to that in which the surface is wiped hundreds of thousands times with a cloth.

Comparative Example 1

For reference purposes, a film was produced by way of trial in the same conditions as in Example 1 except that the substance (1) including an organic fluorine-containing ether group or an organic fluorine-containing polyether group and an alkoxysilyl group was not used. The substance (2) including a fluorocarbon group, a hydrocarbon group, and an alkoxysilyl group was $CF_3-(CF_2)_7-(CH_2)_2-Si(OCH_3)_3$, and the substance (3) including an alkoxysilyl group was $Si(OCH_3)_4$. The concentration of the substance (2) including a fluorocarbon group, a hydrocarbon group, and an alkoxysilyl group and the substance (3) including an alkoxysilyl group was 0.01 M/L and 0.003 M/L, respectively. The results of the water drop contact angle variation in the abrasion resistance test of the resulting film are shown in FIG. 3 in comparison with other results.

Comparative Example 2

Further, a film was produced by way of trial in the same conditions as in Example 1 except that the substance (1) including an organic fluorine-containing ether group or an organic fluorine-containing polyether group and an alkoxysilyl group and the substance (3) including an alkoxysilyl group were not used in Example 1. The substance (2) including a fluorocarbon group, a hydrocarbon group, and an alkoxysilyl group was $CF_3-(CF_2)_7-(CH_2)_2-Si(OCH_3)_3$. The results of the water drop contact angle variation in the abrasion resistance test of the resulting film are shown in FIG. 3 in comparison with other results.

FIG. 3 shows that if the substance (1) including an organic fluorine-containing ether group or an organic fluorine-containing polyether group and an alkoxysilyl group is removed, the initial value of the water drop contact angle is almost the same, but the abrasion resistance is considerably reduced. It also shows that if both the substance (1) including an organic fluorine-containing ether group or an organic fluorine-containing polyether group and an alkoxysilyl group and the substance (3) including an alkoxysilyl group are removed, the abrasion resistance is further substantially reduced.

Further, it was possible to form a composite film having a film thickness of about 15 nm and an initial water drop contact angle of about 110 degrees (critical surface energy is about 8 mN/m) by wiping off an excess composite film-forming solution with a rag containing ethanol. Further, the abrasion resistance at this time was not largely different from the case where it was washed.

It was possible to form a film in substantially the same manner by replacing a methoxy group with an ethoxy group, or with Cl or an NCO group which leads to a different reaction.

Example 2

A composite film was prepared in the same manner as in Example 1 except that the concentration of the substance (1), the substance (2), the substance (3), and the catalyst was 0.01, 0.01, 0.01, and 0.00005 M/L, respectively. In this case, it was possible to form a composite film excellent in abrasion resistance having a composition ratio of about 1:1:1, a film thickness of about 5 nm, and an initial water drop contact angle of about 102 degrees (critical surface energy is about 20 mN/m).

Here, the surface energy of the stainless steel mold on which a releasable composite film is formed substantially depends on the composition of the substance (1) including an organic fluorine-containing ether group or an organic fluorine-containing polyether group and an alkoxysilyl group, the substance (2) including fluorocarbon group, a hydrocarbon group, and an alkoxysilyl group, and the substance (3) including an alkoxysilyl group. Therefore, it was possible to control the surface energy in the range of about 20 to 5 mN/m, and it was also possible to control the fluidity and penetrativity of the molding material according to the molding raw material by changing the charging composition of the substances (1), (2), and (3) in the range of from 1:1:1 to 1:0.1:0.1.

Figure 4:
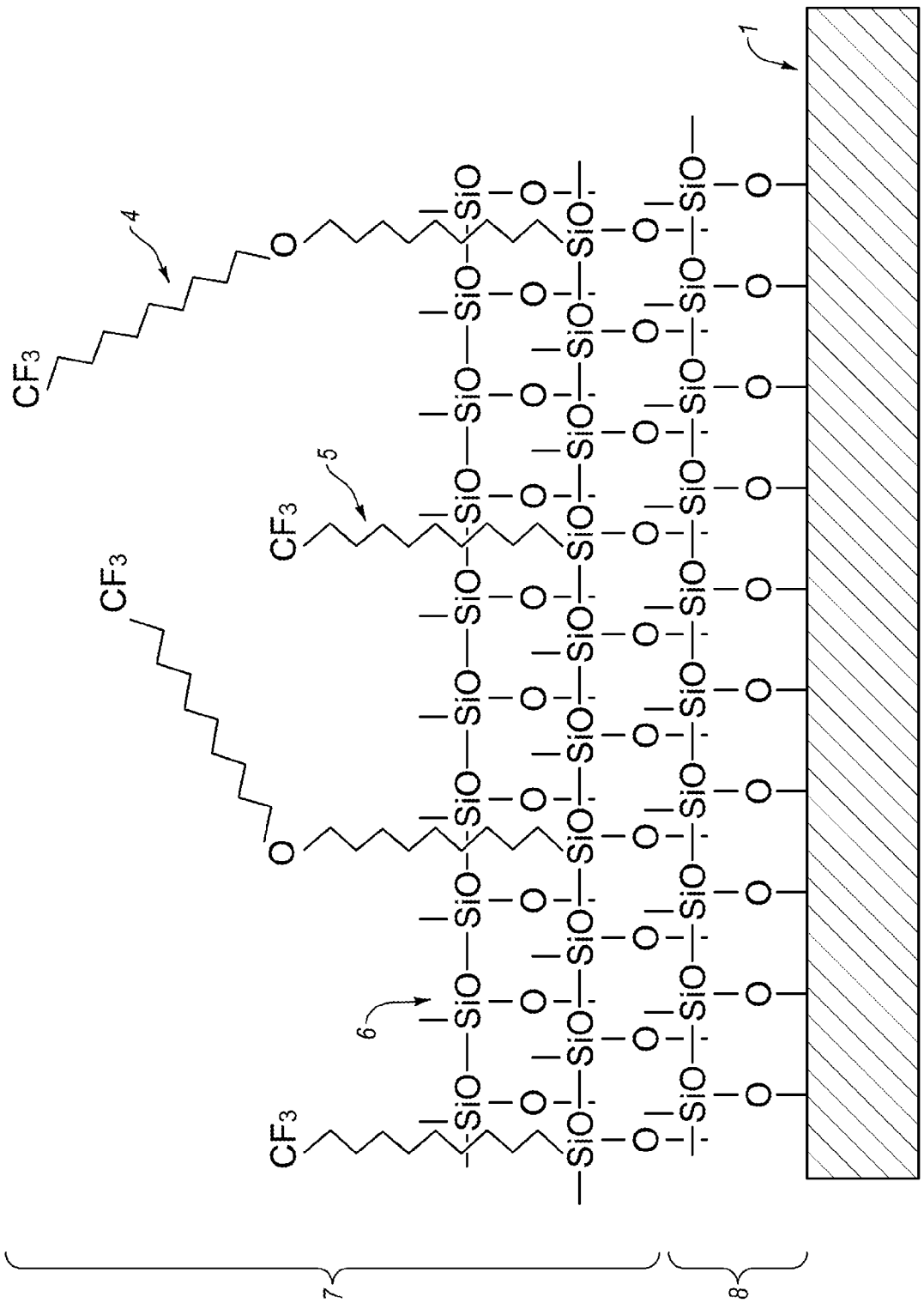
FIG. 4 is a conceptual diagram in which the section of the mold on which a releasable composite film is formed via a silica film in Example 2 is enlarged to the molecular level.

Further, in the case where a composite film was formed via a film (hereinafter, referred to as a silica film 8) previously formed with the composition of the substances (1), (2), and (3) of 0:0:1 (FIG. 4), it was possible to increase the density of the fluorocarbon group of the composite film as compared with the case where no silica film was formed, resulting in an improvement in the abrasion resistance of 2 to 3 times.

Here, it was possible to improve the abrasion resistance by heating, after the composite film is formed, the composite film at a temperature in the range of from 250 to 450° C. for about 30 minutes. Note that, when the heating temperature was in the range of from 250 to 300° C., the composite film was satisfactorily heated in ordinary air, but when the heating temperature was in the range of from 320 to 450° C., it was necessary to heat the composite film in an atmosphere substantially not containing oxygen in order to prevent oxidation of the film.

Example 3

After the immersion reaction in Example 1, the mold was removed from the solution, but the non-aqueous organic solvent was evaporated without washing the mold (in this case, it was possible to facilitate evaporation of the solvent to thereby reduce evaporation time by heating the stainless steel mold at a temperature ranging from 60 to 100° C.). As a result, it was possible to form, on the surface of the stainless steel mold, a composite film in which the composition ratio of the substance including an organic fluorine-containing ether group or an organic fluorine-containing polyether group and a silyl group, the substance including a fluorocarbon group, a hydrocarbon group, and a silyl group, and the substance including a siloxane group was about 1:1:0.3, and the film thickness was about 30 nm.

Note that, in the composite film-forming solution, adsorbed water and many hydroxy groups of natural oxides are contained on the surface of the stainless steel mold. Therefore, the $\equiv Si(OCH_3)$ groups of the substance (1) including an organic fluorine-containing ether group or an organic fluorine-containing polyether group and an alkoxysilyl group, the substance (2) including a fluorocarbon group, a hydrocarbon group, and an alkoxysilyl group, and the substance (3) including an alkoxysilyl group underwent dealcoholization (in this case, $deCH_3OH$ (demethanol)) reaction with the hydroxy groups and adsorbed water on the surface of the stainless steel mold in the presence of the silanol condensation catalyst to form, on the surface of the stainless steel mold, a composite film having a substance including an organic-fluorine containing ether group or an organic fluorine-containing polyether group and a silyl group, a substance including a fluorocarbon group, a hydrocarbon group, and a silyl group, and a substance including a siloxane group, which are chemically bound to each other or to the surface over the entire surface of the mold.

Further, when the mold was exposed to the air to evaporate the solvent, the substance (1) including an organic fluorine-containing ether group or an organic fluorine-containing polyether group and an alkoxysilyl group, the substance (2) including a fluorocarbon group, a hydrocarbon group, and an alkoxysilyl group, and the substance (3) including an alkoxysilyl group remaining on the surface of the mold were hydrolyzed by moisture in the air to be integrated with the composite film having the substance including an organic fluorine-containing ether group or an organic fluorine-containing polyether group and a silyl group, the substance including a fluorocarbon group, a hydrocarbon group, and a silyl group, and the substance including a siloxane group formed on the surface of the mold to form a polymeric composite film having the substance including an organic fluorine-containing ether group or an organic fluorine-containing polyether group and a silyl group, the substance including a fluorocarbon group, a hydrocarbon group, and a silyl group, and the substance including a siloxane group on the surface of the stainless steel mold.

Since the resulting composite film had a thickness of tens nanometers, the film impaired the accuracy of finishing of the mold a little, but it was a satisfactory level even in the molding of optical components. Further, the water drop contact angle of the surface of the stainless steel mold was about 105 degrees (critical surface energy is about 15 mN/m) regardless of the presence of a washing step, indicating that a mold releasability equal to or higher than that of a Teflon™ coating was imparted.

Further, the abrasion test results were improved about 10 times as compared with those in Example 1.

Example 4

A film was produced in the same manner as in Example 1 except that the substance (2) including a fluorocarbon group, a hydrocarbon group, and an alkoxysilyl group was removed.

In this case, it was also possible to form a composite film having a thickness of about 5 nm, which has the substance including an organic fluorine-containing ether group or an organic fluorine-containing polyether group and a silyl group and the substance including a siloxane group, on the surface of the stainless steel mold.

Since the composite film had a thickness of nanometer order at this time, the film did not at all impair the accuracy of finishing of the mold. Further, the water drop contact angle of the surface of the stainless steel mold was about 108 degrees (critical surface energy is about 12 mN/m) regardless of the presence of a washing step, indicating that a mold releasability equal to or higher than that of a Teflon™ coating was imparted.

Further, in the abrasion test, the same results as in Example 1 were obtained.

Example 5

A film was produced in the same manner as in Example 1 except that the substance (3) including an alkoxysilyl group was removed.

In this case, it was naturally possible to form a composite film having a thickness of about 4 nm, which has the substance including an organic fluorine-containing ether group or an organic fluorine-containing polyether group and a silyl group and the substance including a fluorocarbon group, a hydrocarbon group, and an silyl group, on the surface of the stainless steel mold.

Since the composite film had a thickness of nanometer order also at this time, the film did not at all impair the accuracy of finishing of the mold. Further, the water drop contact angle of the surface of the stainless steel mold was about 114 degrees (critical surface energy is about 6 mN/m) regardless of the presence of a washing step, indicating that a mold releasability significantly higher than that of a Teflon™ coating was imparted.

Further, in the abrasion test, the abrasion resistance dropped in a little shorter time than in Example 1, but substantially the same results as in Example 1 were obtained.

Example 6

A film was produced in the same manner as in Example 1 except that the substance (2) including a fluorocarbon group, a hydrocarbon group, and an alkoxysilyl group and the substance (3) including an alkoxysilyl group were removed.

In this case, it was naturally possible to form a film having a thickness of about 3 nm, which comprises the substance (1) including an organic fluorine-containing ether group or an organic fluorine-containing polyether group and a silyl group, on the surface of the stainless steel mold.

Since the composite film had a thickness of nanometer order also at this time, the film did not at all impair the accuracy of finishing of the mold. Further, the water drop contact angle of the surface of the stainless steel mold was about 116 degrees (critical surface energy is about 5 mN/m) regardless of the presence of a washing step, indicating that a mold releasability significantly higher than that of a Teflon™ coating was imparted.

In the abrasion test, the abrasion resistance dropped in a little shorter time than in Example 1, but the film was usable on a practical level.

Note that, although this film was excellent in mold releasability, it was found that the film had a little poorer fluidity and penetrativity of a molding material in the mold than the composite film obtained in Example 1.

Example 7

Further, it was possible to use a ketimine compound, a metal oxide such as $TiO_2$, an organic acid, an aldimine compound, an enamine compound, an oxazolidine compound, and an aminoalkylalkoxysilane compound instead of the silanol condensation catalyst in Example 1.

For example, it was possible to reduce the reaction time to 30 minutes when a ketimine compound (H3 available from Japan Epoxy Resins Co. Ltd. and Sila-Ace S340 available from Chisso Corporation were used, but the performance was almost the same) was used at the same concentration instead of the silanol condensation catalyst in Example 1.

Example 8

Further, it was possible to further reduce the reaction time by using a ketimine compound, a metal oxide such as $TiO_2$, an organic acid, an aldimine compound, an enamine compound, an oxazolidine compound, or an aminoalkylalkoxysilane compound in combination with the silanol condensation catalyst in Example 1 in a mixing ratio of from 1:9 to 9:1.

Specifically, it was possible to reduce the reaction time to 20 minutes by replacing half the above-described silanol condensation catalyst with equal mole (1:1) of the above-described ketimine compound (for example, S340) in Example 1.

The silanol condensation catalyst applicable to all the Examples described above includes metal carboxylates, carboxylate ester metal salts, metal carboxylate polymers, metal carboxylate chelates, titanate esters, and titanate ester chelates. More specifically, there can be used stannous acetate, dibutyltin dilaurate, dibutyltin dioctate, dibutyltin diacetate, dioctyltin dilaurate, dioctyltin dioctate, dioctyltin diacetate, stannous dioctanoate, lead naphthenate, cobalt naphthenate, iron 2-ethylhexenate, dioctyltin bisoctyl thioglycolic acid ester salt, dioctyltin maleic acid ester salt, dibutyltin maleate polymer, dimethyltin mercaptopropionate polymer, dibutyltin bisacetylacetate, dioctyltin bisacetyllaurate, tetrabutyl titanate, tetranonyl titanate, and bis(acetylacetonyl)dipropyltitanate.

Further, examples of the applicable ketimine compounds include, but are not particularly limited to, 2,5,8-triaza-1,8-nonadiene, 3,11-dimethyl-4,7,10-triaza-3,10-tridecadiene, 2,10-dimethyl-3,6,9-triaza-2,9-undecadiene, 2,4,12,14-tetramethyl-5,8,11-triaza-4,11-pentadecadiene, 2,4,15,17-tetramethyl-5,8,11,14-tetraaza-4,14-octadecadiene, and 2,4,20,22-tetramethyl-5,12,19-triaza-4,19-trieicosadiene.

Further, examples of the applicable organic acids include, but are not particularly limited to, formic acid, acetic acid, propionic acid, butyric acid, and malonic acid. Those organic acids produced almost the same effects.

Note that, in the case where a film is formed by evaporating a solvent of a composite film-forming solution, it is advantageous that the boiling point of a non-aqueous solvent used for the composite film-forming solution is as low as possible because the solvent can be evaporated and removed in a shorter time. However, a boiling point in the range of from about 50 to 150° C. was good for handling.

On the other hand, when post-washing is performed, the higher the boiling point of the fluorocarbon-based organic solvent used for a composite film-forming solution, the more stable the solution. However, a boiling point in the range of from about 150 to 350° C. was good for handling.

Note that, the fluorocarbon-based organic solvents include fluorocarbon solvents, "Fluorinert" (manufactured by 3M Company) and "Aflude" (manufactured by Asahi Glass Co., Ltd.). These may be used alone or in combination of two or more if they are sufficiently compatible. In addition, it was possible to add an organic chlorinated solvent such as chloroform to the above solvent. Furthermore, although a silanol condensation catalyst and ketimine, a co-catalyst, cannot be used when a mixed solvent of water and alcohol (a good result was obtained by a composition ratio of water to alcohol of 2:1 to 10:1 in terms of the volume ratio and using ethanol as alcohol, but propanol, butanol, and ethylene glycol were also applicable) is used as an adsorption solvent, it was possible to form a good chemisorbed monomolecular film in about 1 hour by using ultrasonic dispersion even when a catalyst was not used.

Further, a hydrocarbon-based solvent containing no water, a fluorocarbon-based solvent, or a silicone-based solvent can be used as an organic solvent for washing, but those having a boiling point of 50 to 300° C. were suitable for use.

Specific examples of the organic solvent for washing usable include petroleum naphtha, solvent naphtha, petroleum ether, petroleum benzine, isoparaffin, normal paraffin, decalin, industrial gasoline, kerosene, dimethyl silicone, phenyl silicone, alkyl-modified silicone, and polyether silicone.

Furthermore, a substance represented by the following formula (Formula 12 or 13) was applicable as the substance (1) including an organic fluorine-containing ether group or an organic fluorine-containing polyether group and an alkoxysilyl group. In addition, a substance represented by the following formula (Formula 14) was applicable although light resistance was a little poor. In each case, a substance having an average molecular weight of about 2000 to 5000 was easy to use.

[Formula 12]

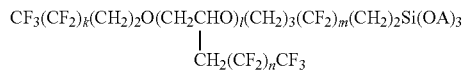
$$CF_3(CF_2)_k(CH_2)_2O(CH_2CHO)_l(CH_2)_3(CF_2)_m(CH_2)_2Si(OA)_3$$
$$|$$
$$CH_2(CF_2)_nCF_3$$

(A represents an alkyl group; OA may represent Cl or NCO; and k, l, m, and n each represent an integer)

[Formula 13]

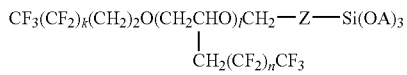
$$CF_3(CF_2)_k(CH_2)_2O(CH_2CHO)_lCH_2-Z-Si(OA)_3$$
$$|$$
$$CH_2(CF_2)_nCF_3$$

(A represents an alkyl group; OA may represent Cl or NCO; Z represents a linear functional group represented by $(CH_2)_mO(CH_2)_m$ or $(CH_2)_2O(CH_2)_mO(CH_2)_2$; and k, l, m, and n each represent an interger)

[Formula 14]

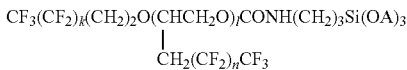
$$CF_3(CF_2)_k(CH_2)_2O(CHCH_2O)_lCONH(CH_2)_3Si(OA)_3$$
$$|$$
$$CH_2(CF_2)_nCF_3$$

(A represents an alkyl group; and k, l, and n each represent an integer)

More specifically, a substance represented by the following formula (Formula 15) or the formula (Formula 16) was applicable.

[Formula 15]

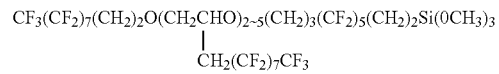
$$CF_3(CF_2)_7(CH_2)_2O(CH_2CHO)_{2-5}(CH_2)_3(CF_2)_5(CH_2)_2Si(OCH_3)_3$$
$$|$$
$$CH_2(CF_2)_7CF_3$$

[Formula 16]

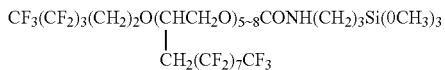
$$CF_3(CF_2)_3(CH_2)_2O(CHCH_2O)_{5-8}CONH(CH_2)_3Si(OCH_3)_3$$
$$|$$
$$CH_2(CF_2)_7CF_3$$

Further, $CF_3-(CF_2)_n-(CH_2)_2-Si(OA)_3$ (wherein subscript o represents an integer of 1 to 10, and A represents an alkyl group such as a methyl group or an ethyl group) is mentioned as the substance (2) including a fluorocarbon group, a hydrocarbon group, and an alkoxysilyl group. Specifically, substances (1) through (18) as shown below were easy to use.

(1) $CF_3CH_2O(CH_2)_{15}Si(OCH_3)_3$
(2) $CF_3(CH_2)_2Si(CH_3)_2(CH_2)_{15}Si(OCH_3)_3$
(3) $CF_3(CH_2)_6Si(CH_3)_2(CH_2)_9Si(OCH_3)_3$
(4) $CF_3COO(CH_2)_{15}Si(OCH_3)_3$
(5) $CF_3(CF_2)_7(CH_2)_2Si(OCH_3)_3$
(6) $CF_3(CF_2)_5(CH_2)_2Si(OCH_3)_3$
(7) $CF_3(CF_2)_7C_6H_4Si(OCH_3)_3$
(8) $CF_3CH_2O(CH_2)_{15}Si(OC_2H_5)_3$
(9) $CF_3(CH_2)_2Si(CH_3)_2(CH_2)_{15}Si(OC_2H_5)_3$
(10) $CF_3(CH_2)_6Si(CH_3)_2(CH_2)_9Si(OC_2H_5)_3$
(11) $CF_3COO(CH_2)_{15}Si(OC_2H_5)_3$
(12) $CF_3(CF_2)_7(CH_2)_2Si(OC_2H_5)_3$
(13) $CF_3(CF_2)_5(CH_2)_2Si(OC_3H_7)_3$
(14) $CF_3(CF_2)_7C_6H_4Si(OC_2H_5)_3$
(15) $(CF_3(CF_2)_7(CH_2)_2)_2Si(OCH_3)_2$
(16) $(CF_3(CF_2)_5(CH_2)_2)_2Si(OCH_3)_2$
(17) $(CF_3(CF_2)_7(CH_2)_2)_3SiOCH_3$
(18) $(CF_3(CF_2)_5(CH_2)_2)_3SiOCH_3$

In addition, $(AO)_3Si(OSi(OA)_2)_pOA$ (wherein p represents 0 to 10; A represents an alkyl group such as a methyl group or an ethyl group; and OA may represent Cl or NCO) is mentioned as the substance (3) including an alkoxysilyl group. Specifically, substances (1) through (14) as shown below were easy to use.

(1) $Si(OCH_3)_4$
(2) $SiH(OCH_3)_3$
(3) $SiH_2(OCH_3)_2$ (4) $(CH_3)_3Si(OSi(OCH_3)_2)_mOCH_3$
(5) $Si(OC_2H_5)_3$
(6) $SiH(OC_2H_5)_3$
(7) $SiH_2(OC_2H_5)_2$
(8) $(H_5C_2O)_3Si(OSi(OC_2H_5)_2)_mOC_2H_5$

Here, m represents an integer of 1 to 6.

The invention claimed is:

1. A releasable mold comprising:
a highly durable releasable composite film formed on a surface of the mold, wherein the film is a composite film derived from the reaction of:
a first substance having a formula $CF_3-(CF_2)_o-(CH_2)_2-Si(OA)_3$, wherein subscript o represents an integer, A represents an alkyl group, and OA represents one of a Cl or NCO;
a second substance having one of Formula 3, Formula 4 or Formula 5, the second substance exhibiting a molecule length that is greater than a molecule length of the first substance; and

[Formula 3]

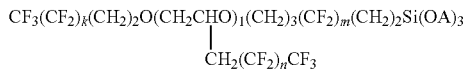

(A represents an alkyl group; OA may represent Cl or NCO; and k, l, m, and n each represent an integer)

[Formula 4]

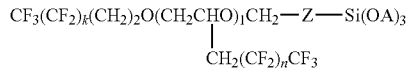

(A represents an alkyl group; OA may represent Cl or NCO; Z represents a linear functional group represented by $(CH_2)_m$, $O(CH_2)_m$, or $(CH_2)_2O(CH_2)_mO(CH_2)_2$; and k, l, m, and n each represent an integer);

[Formula 5]

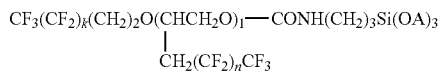

(A represents an alkyl group; and k, l, and n each represent an integer);

a third substance having a formula $(AO)_3Si(OSi(OA)_2)_pOA$, wherein p represents 0 or an integer, A represents an alkyl group, and OA represents one of a Cl or NCO; and
the releasable composite film is bonded to the surface of the mold via the third substance.

2. The releasable mold according to claim 1, wherein the second substance and the first substance are bound to the third substance.

3. The releasable mold according to claim 1, wherein the second substance, the first substance, and the third substance are bound to each other or independently to the surface of the mold.

4. The releasable mold according to claim 1, wherein a molecular composition ratio of the second substance, first substance, and the third substance contained in the releasable composite film is in a range of from 1:10:10 to 1:0.1:0.1.

5. The releasable mold according to claim 1, wherein the second substance of the releasable composite film includes at least a fluorocarbon group and a hydrocarbon group, and has a critical surface energy controlled in a range of from 5 to 20 mN/m.

6. The releasable mold according to claim 1, wherein the composite film further includes a methylsilyl group.

7. A releasable mold comprising:
a highly durable releasable composite film formed on a surface of the mold, wherein the film is a composite film derived from the reaction of:
a first substance having a formula $CF_3-(CF_2)_o-(CH_2)_2-Si(OA)_3$, wherein subscript o represents an integer, A represents an alkyl group, and OA may represent Cl or NCO;
a second substance having one of Formula 3, Formula 4 or Formula 5, the second substance exhibiting a molecule length that is greater than a molecule length of the first substance; and

[Formula 3]

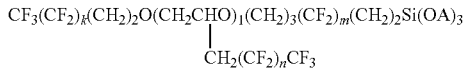

(A represents an alkyl group; OA may represent Cl or NCO; and k, l, m, and n each represent an integer)

[Formula 4]

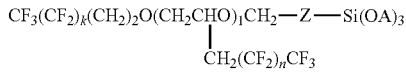

(A represents an alkyl group; OA may represent Cl or NCO; Z represents a linear functional group represented by $(CH_2)_m$, $O(CH_2)_m$, or $(CH_2)_2O(CH_2)_mO(CH_2)_2$; and k, l, m, and n each represent an integer);

[Formula 5]

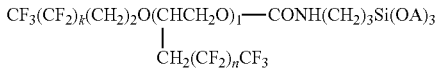

(A represents an alkyl group; and k, l, and n each represent an integer);

a third substance having a formula $(AO)_3Si(OSi(OA)_2)_pOA$, wherein p represents 0 or an integer, A represents an alkyl group, and OA represents one of a Cl or NCO;
the releasable composite film is bonded to the surface of the mold via the third substance; and
a molecular composition ratio of the first substance, the second substance, and the third substance contained in the releasable composite film is in a range of from 1:10:10 to 1:0.1:0.1.

* * * * *

UNITED STATES PATENT AND TRADEMARK OFFICE
CERTIFICATE OF CORRECTION

PATENT NO. : 8,623,127 B2
APPLICATION NO. : 12/666954
DATED : January 7, 2014
INVENTOR(S) : Ogawa It is certified that error appears in the above-identified patent and that said Letters Patent is hereby corrected as shown below:

In the Specification

Column 9, Line 20, delete "steps of bringing" and insert -- steps of: bringing --, therefor.

Column 16, Lines 14-16, in [Formula 14], delete " 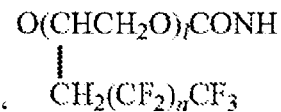 "

and insert -- 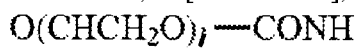 --, therefor.

Column 16, Line 26, in [Formula 15], delete "$(CF_2)_5(CH_2)_2Si(OCH_3)_3$" and insert -- $(CF_2)_5(CH_2)_2Si(OCH_3)_3$ --, therefor.

Column 16, Lines 29-31, in [Formula 16], delete " 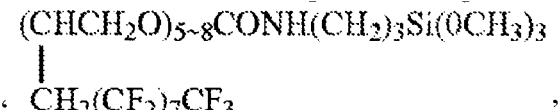 "

and insert --  --, therefor.

Column 16, Line 34, delete "$(CF_2)_n$" and insert -- $(CF_2)_o$ --, therefor.

Signed and Sealed this
Twentieth Day of May, 2014

Michelle K. Lee
*Deputy Director of the United States Patent and Trademark Office*